United States Patent [19]

Benecke et al.

[11] 4,387,419
[45] Jun. 7, 1983

[54] STATIONARY MAGNETIC FREQUENCY MULTIPLIER

[75] Inventors: Wilhelm Benecke, Bad Neustadt, Fed. Rep. of Germany; Heinz Rosenberg, Vienna, Austria

[73] Assignee: Siemens Aktiengesellschaft, Munich, Fed. Rep. of Germany

[21] Appl. No.: 238,369

[22] Filed: Feb. 26, 1981

[30] Foreign Application Priority Data

Mar. 3, 1980 [DE] Fed. Rep. of Germany ....... 3008125

[51] Int. Cl.$^3$ .............................................. H02M 5/32
[52] U.S. Cl. ..................................... 363/174; 310/160
[58] Field of Search ................ 310/160; 363/174, 170, 363/171

[56] References Cited
U.S. PATENT DOCUMENTS 1,559,295 10/1925 Stoller ................................ 363/170

FOREIGN PATENT DOCUMENTS 630289 10/1949 United Kingdom ................ 310/160

Primary Examiner—William M. Shoop
Attorney, Agent, or Firm—Kenyon & Kenyon

[57] ABSTRACT

In stationary magnetic frequency multipliers which comprise a polyphase primary winding distributed in slots and a secondary winding magnetically coupled to the former, a travelling field can be produced if the primary and secondary windings, designed as ring windings, are arranged in two opposite rows of slots of an iron member with which a return member is so closely associated as to rest isolated against the tooth ends of the latter. In order that at least the primary winding neet not extend over at least two full pole pitches, laminated connecting parts are provided outside of the wound zone of the respective slotted iron member. These connecting parts establish a magnetic connection between the slotted iron member and the return member and are designed so that they remain unsaturated in any operating state.

8 Claims, 6 Drawing Figures

STATIONARY MAGNETIC FREQUENCY MULTIPLIER

BACKGROUND OF THE INVENTION

This invention relates to a stationary magnetic frequency multiplier that comprises laminated iron members, a polyphase primary winding and a secondary winding. The iron members form a closed magnetic circuit and at least one of the members has slots, the primary winding is arranged to have a number of pole pairs $p_1$, and the secondary winding is magnetically coupled to the primary winding and has a number of pole pairs $p_2$ equal to an odd multiple of the number of pole pairs $p_1$ of the primary winding. In this multiplier a cross section of the iron members is saturated by the magnetic field produced by the primary winding, if it is supplied with a certain primary voltage at a certain frequency, and the primary and secondary windings are arranged so that a voltage can be induced at the terminal of the primary winding only by the fundamental of a field with a number of pole pairs $p_1$ and no voltage can be induced by the same fundamental at the terminals of the secondary winding. The primary and secondary windings are formed as ring windings and are arranged in two rows of slots in such a manner that they set up travelling fields if fed in the polyphase mode. A magnetic return is provided by laminated iron members adjacent the ends of the teeth of the slotted iron member.

Such a travelling-field design of the frequency multiplier is proposed in U.S. application Ser. No. 127,575, in which the slotted zone of the iron member in question extends over an even multiple of the pole pitch of the primary winding since only then is the algebraic sum of all tooth fluxes permanently equal to zero and, therefore, no further flux path is required, besides the teeth, between the iron members provided with the windings and the iron members forming the magnetic return.

In order to obtain freedom from harmonics of the primary and secondary winding, it is preferable that the number of slots per pole and leg not be too small. The more slots are required, the higher the secondary frequency and, as a result, the higher the number of poles of the secondary winding. For technological reasons, there is a limit to how small the teeth and the slots that define them can be made. The number of slots required for two full primary pole pitches can, therefore, require the slotted zone of the iron member to be so long that the dimensions and proportions of the iron member become difficult to deal with, especially in the case of frequency multipliers with lower power ratings.

OBJECTS AND SUMMARY OF THE INVENTION

It is an object of the invention to provide a frequency multiplier of the general type just described, but so arranged that it can always be constructed with suitable dimensions.

Other objects may be apparent to those skilled in this art after they have read the following description together with the drawings.

According to the invention, the stated problem can be solved by arranging the laminated iron members outside of the wound zone to form magnetic connecting parts that remain unsaturated between the iron member surrounded by the windings and the return members. In such a frequency multiplier, the primary winding extends over less than two full pole pitches. Therefore, fewer slots are required and the overall length of the slotted iron member is reduced.

DETAILED DESCRIPTION OF THE INVENTION

Figure 1:
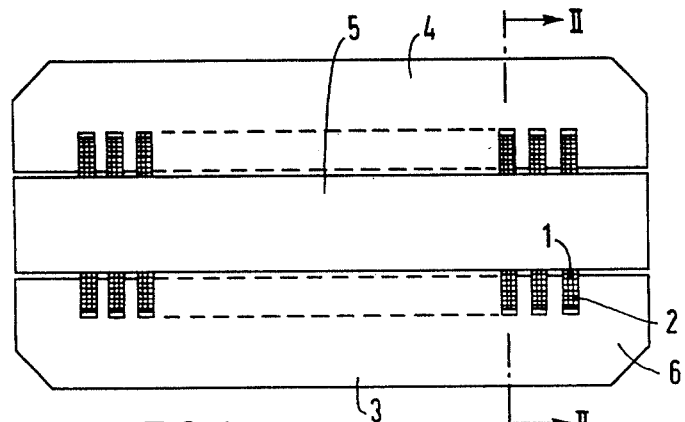
FIG. 1 shows a longitudinal cross-sectional view of a frequency multiplier in which the slots for receiving the primary and secondary windings are arranged in the iron members forming the magnetic return.
Figure 2:
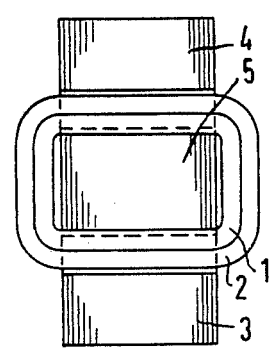
FIG. 2 is a transverse cross-sectional view of the frequency multiplier shown in FIG. 1.

FIGS. 1 and 2 show a converter that has a polyphase primary winding 1 and a secondary winding 2 in slots in laminated iron members 3 and 4. These members, together with a laminated iron member 5, form substantially closed paths for flux produced by currents in the windings. A similar structure is shown in FIG. 3, except that in FIG. 1 the windings 1 and 2 are in slots in the members 3 and 4 and the return member 5 is not slotted, while in FIG. 3 the slots are in the member 5 and the members 3 and 4 form the returns.

Figure 3:
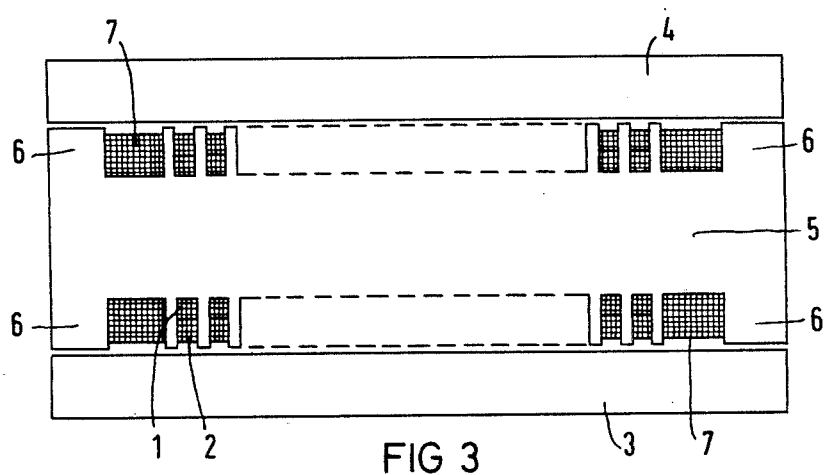
FIG. 3 is a longitudinal cross-sectional view of a frequency multiplier in which the slots are arranged in the iron member enclosed by the primary and secondary windings.

In the frequency multipliers shown in FIGS. 1 to 3, the polyphase primary winding 1, which, together with the secondary winding 2, surrounds the iron member 5, extends over less than two full pole pitches. Therefore, fewer slots are required for the primary and secondary windings than in a design in which the polyphase primary winding always extends over at least two full pole pitches. Since the polyphase primary winding 1 extends over less than two full pole pitches, the sum of all tooth fluxes is not permanently zero. Instead, there is a magnetic alternating flux which is conducted to the return iron members 3 and 4 through laminated connecting parts 6 arranged outside the wound zone. The magnetic connecting parts 6 are wide enough so that they remain unsaturated in all foreseen operating states in order not to interfere with the operation of the saturated regions in the return path.

Since at least the primary winding 1 does not extend over an entire pole pitch pair or an integral multiple thereof, the sum of the magnetic fields is also not permanently zero, like the sum of all tooth fluxes. In the embodiment of the frequency multiplier shown in FIG. 1, in which saturation exists in the return path, or yoke, with unsaturated teeth, the fact that the sum of the magnetic fields is not permanently zero is of no significance since all magnetic fields are cancelled by the saturation in the return path. This allows the laminated connecting parts b, as well as the teeth, for which they form a magnetic shunt, to remain unsaturated without taking special measures. If, on the other hand, tooth saturation occurred with the return path remaining unsaturated in the embodiment according to FIG. 1, the sum of the respective magnetic fields of the winding would drive an additional, parasitic, alternating magnetic flux through the magnetic circuit that consists of the iron members 3, 4 and 5 as well as of the magnetic connecting parts 6. This additional flux would saturate these parts, would interfere with their functions, and would induce undesired inductive voltage drops in the windings.

In order to prevent this, FIG. 3 shows a modified embodiment that includes compensation windings 7 arranged for tooth saturation between the ends of the toothed zone and the magnetic connecting parts 6. These compensation windings are designed and connected in series with the primary and secondary windings 1 and 2, respectively, so that they cancel part of the alternating magnetic field generated by the primary and secondary windings.

Figure 6:
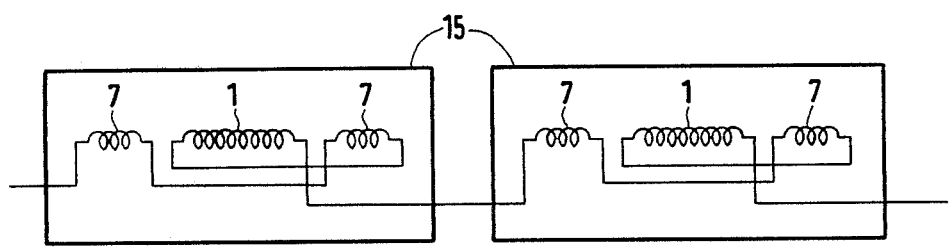
FIG. 6 is a block diagram illustrating two magnetic frequency multipliers coupled in series.
Figure 7:
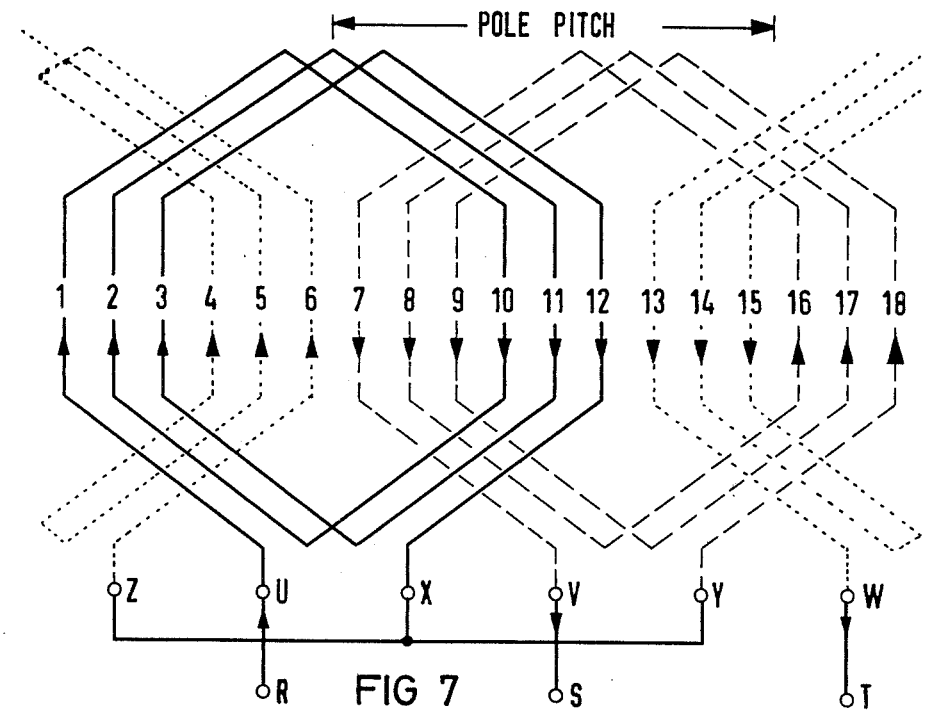
Figure 8:
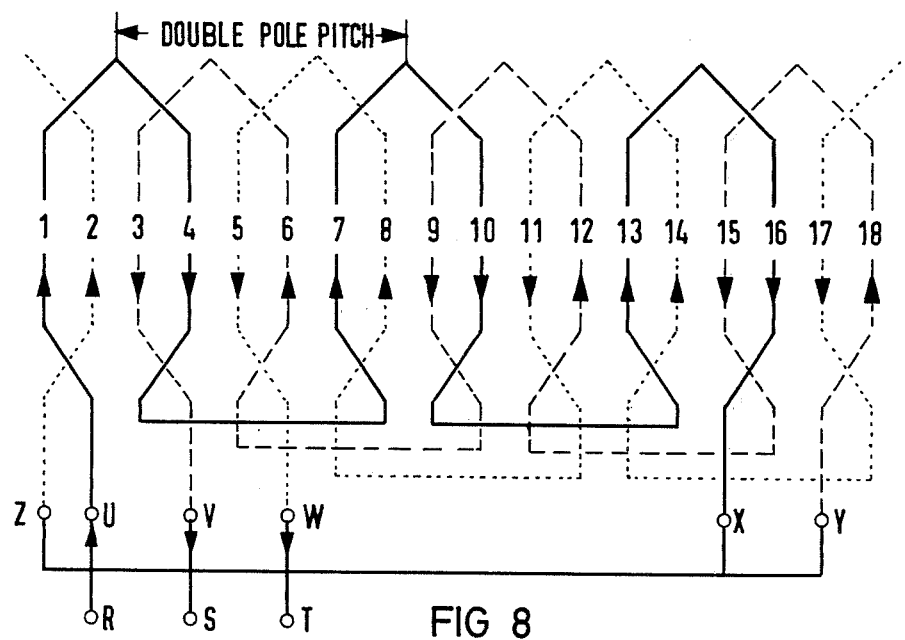
Figure 9:
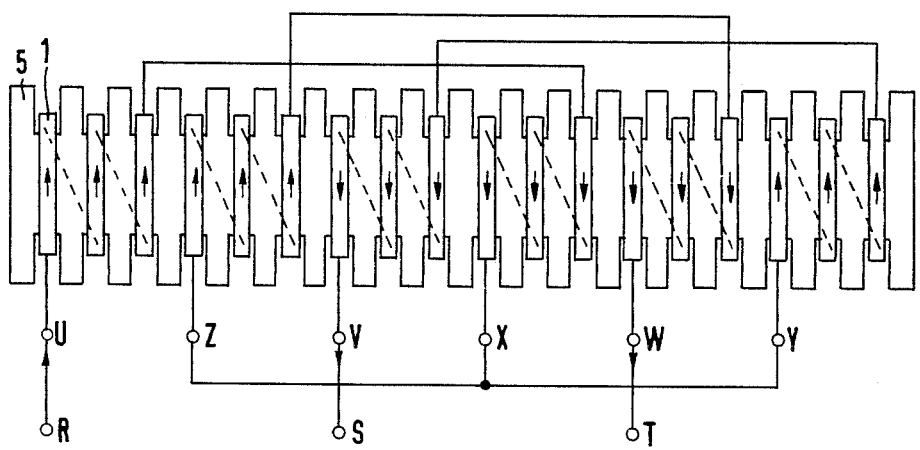
Figure 10:
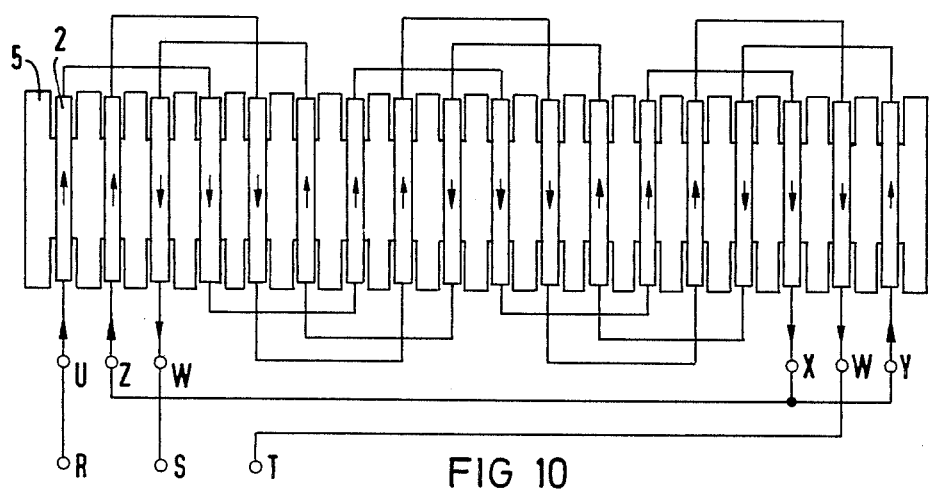
Figure 11:
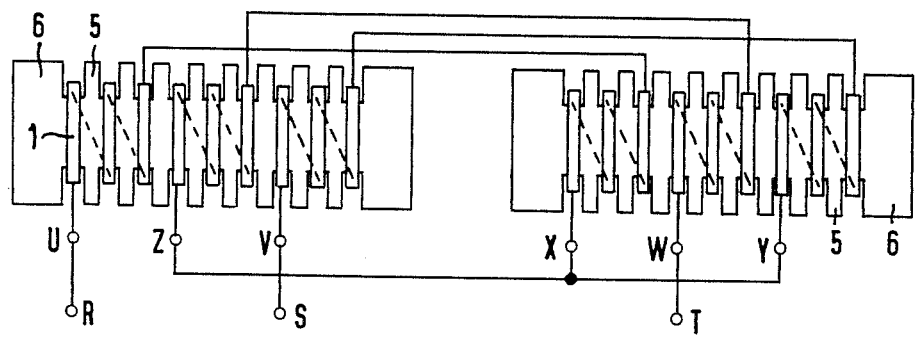
Figure 12:
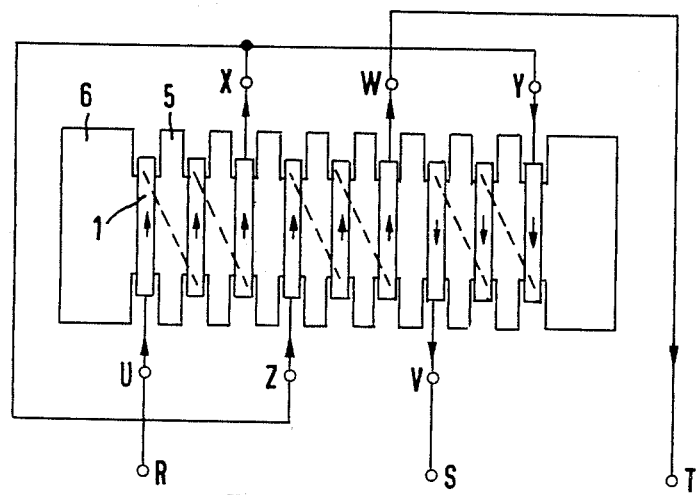

It may be advantageous to extend the primary winding 1 over an entire pole pitch pair or an integral multiple thereof in order, for instance, to obtain symmetry for all legs with respect to load and voltage drops. This is achieved by providing the frequency multiplier with two or more separately arranged iron members 5 and with connecting parts 6 arranged between the latter and their respective return members 3 and 4, where the primary windings 1 arranged in the slots of the iron members 5 or in the slots of the members 3 and 4 are connected in series and are designed so that, together, they comprise an integral multiple of the pole pitch. This is illustrated by FIG. 6 in which there are shown in block diagram form, two magnetic frequency multipliers 15 according to FIG. 3, each having a winding 1 in series with a compensating winding 7, with the windings of the two units connected in series.

The slots intended to receive the primary and secondary windings 1 and 2, formed as ring windings, may be provided as desired in the iron member 5 as shown in FIG. 3, or the winding 1 and 2 may be provided in the iron members 3 and 4 forming the return, as shown in FIGS. 1 and 2. In FIG. 3 the windings are wound in the slots, which is advantageous for the heat transfer between the winding and the iron. In FIGS. 1 and 2, the individual coils of the winding can be prefabricated and slipped over the iron member 5, after which the iron members 3 and 4 forming the return are placed over them. This is advantageous at higher voltages from an insulation point of view.

The magnetic connecting parts 6 may be designed as a continuation of the iron member 5 (FIG. 3) or of the iron members 3 and 4 (FIG. 1) forming the return, in which the respective iron members 3 and 4 preferably also contain the slots for the windings.

Figure 4:
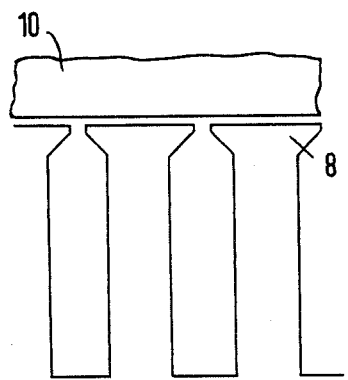
FIGS. 4 and 5 show tooth end contours that result in a transfer cross section larger than the tooth cross section for the magnetic flux.
Figure 5:
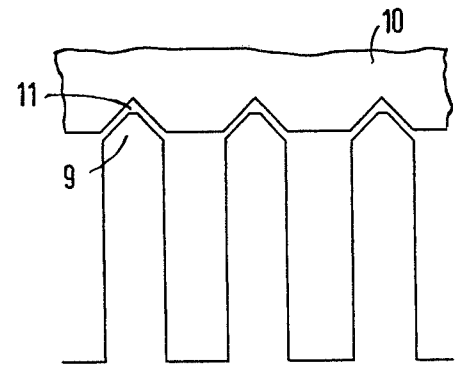

If a material with higher saturation flux density is used for the iron member 5 or the members 3 and 4, each provided with the slots, than is exhibited by the material of the unutilized iron members, it is proposed, according to the invention, to shape the contour of the ends 8 and 9 of the teeth in such a manner as to prevent troublesome magnetic constrictions. As shown in FIGS. 4 and 5, this is arranged by forming the transfer cross section for the magnetic flux from one tooth head 8 or 9 to the adjacent iron member 10 so that the effective width of the portion of each tooth at the air gap is larger than the tooth cross section. According to FIG. 4, this is achieved by designing the teeth 8 to form half-closed slots. If open slots are required for technical reasons related to the winding, the embodiment shown in FIG. 5 can be used in which the teeth 9 are chamfered in roof-fashion, and at least the chamfered ends extend into corresponding depressions 11 of the iron member 10 forming the return.

What is claimed is:

1. A stationary magnetic frequency multiplier comprising:
   (a) a laminated iron magnetic member;
   (b) a laminated iron magnetic return member disposed adjacent thereto;
   (c) a slotted zone, comprising two rows of slots, in one of said iron members;
   (d) a polyphase primary winding with a pole pitch such as would result in a number of pole pairs $p_1$, if fully wound, extending over less than two full pole pitches, distributed in said slots;
   (e) a polyphase secondary winding magnetically coupled to said primary winding having a pole pitch which would provide a number of pole pairs which is an odd multiple of the number of pole pairs of said primary winding if fully wound, also distributed in said slots;
   (f) the primary and secondary windings being arranged in said slotted zone so that a voltage can be induced across the primary winding only by the fundamental of a field with a number of pole pairs $p_1$ and no voltage can be induced by the same fundamental at the terminal of the secondary winding;
   (g) the primary and secondary windings comprising ring windings surrounding said iron member arranged in said two rows of slots as a wound zone in such a manner that they set up traveling fields if fed in the polyphase mode; and
   (h) laminated connecting parts outside said wound zone, which remain unsaturated, disposed between said iron member surrounded by windings and said return member.

2. The invention according to claim 1 in which the slots receiving the primary and secondary winding are provided in the iron means surrounded by the windings.

3. The invention according to claim 1 in which the magnetic connecting parts are extensions of at least one of the iron means of the magnetic circuit.

4. The invention according to claim 3 in which the magnetic connecting parts are extensions of the respective iron means provided with slots.

5. The invention according to claim 1 in which the contour of at least part of the ends of the teeth has a transfer cross section for the magnetic flux from each tooth to the adjacent iron means that is larger than the tooth cross section.

6. The invention according to claim 1 in which the means outside of the wound zone comprise portions of at least one of the iron means; and compensation winding means the portions, the compensation winding means being connected in series with the primary and secondary windings.

7. The invention according to claim 1 and 2 and further including at least one further stationery magnetic frequency multiplier including iron means, magnetic return means and ferromagnetic connecting parts between the iron means and the magnetic return means, the primary windings arranged in the slots of the further stationery magnetic frequency multiplier coupled in series with the windings arranged in the slots of the magnetic frequency multiplier, said magnetic frequency multiplier and at least one further magnetic frequency multiplier designed so that, together, they comprise an integral multiple of the pole pitch.

8. The invention according to claim 7 wherein the primary winding of the slotted members of said respective magnetic frequency multipliers does not comprise an even numbered multiple of the pole pitch and further including compensation windings arranged between the ends of the slotted zones and the magnet connecting parts.

* * * * *